United States Patent [19]

Brandhorst, Jr.

[11] B 3,989,541

[45] Nov. 2, 1976

[54] SOLAR CELL ASSEMBLY

[75] Inventor: Henry W. Brandhorst, Jr., Berea, Ohio

[73] Assignee: The United States of America as represented by the United States National Aeronautics and Space Administration, Washington, D.C.

[22] Filed: Sept. 30, 1974

[21] Appl. No.: 510,677

[44] Published under the second Trial Voluntary Protest Program on February 24, 1976 as document No. B 510,677.

[52] U.S. Cl. .................................................. 136/89
[51] Int. Cl.² .................... H01L 31/00; H01L 31/04
[58] Field of Search ........................................ 136/89

[56] References Cited
UNITED STATES PATENTS

| | | | |
|---|---|---|---|
| 3,313,971 | 4/1967 | Nagy | 136/89 X |
| 3,472,698 | 10/1969 | Mandelkorn | 136/89 |
| 3,490,950 | 1/1970 | Myer | 136/89 |
| 3,532,551 | 10/1970 | Scott | 136/89 |
| 3,533,850 | 10/1970 | Tarneja et al. | 136/89 |
| 3,539,883 | 11/1970 | Harrison | 136/89 X |
| 3,615,853 | 10/1971 | Goldsmith et al. | 136/89 |
| 3,653,970 | 4/1972 | Iles | 136/89 |
| 3,888,697 | 6/1975 | Bogos et al. | 136/89 |

Primary Examiner—T. Tung
Assistant Examiner—Aaron Weisstuch
Attorney, Agent, or Firm—Norman T. Musial; Gene E. Shook; John R. Manning

[57] ABSTRACT

An improved solar cell assembly is provided for use under high intensity illumination conditions where heat is a problem.

The solar cell assembly includes a solar cell having an overlay of a semi-transparent coating of a metal, such as aluminum or silver, which covers the entire surface thereof. The purpose of the coating is to lower the amount of incident radiation on the cell and thereby lower cell temperature. The use of the semi-transparent coating over the entire cell surface uniformly limits incident radiation and hence reduces cell heat without any temperature gradients. The coating also lowers series cell resistance. The coating may be directly deposited on the cell surface or on the undersurface of a cover plate bonded to the cell.

9 Claims, 2 Drawing Figures

SOLAR CELL ASSEMBLY

ORIGIN OF THE INVENTION

The invention described herein was made by an employee of the United States Government and may be manufactured or used by or for the Government without the payment of any royalties thereon or therefor.

FIELD OF THE INVENTION

This application relates to a solar cell assembly which is particularly adapted for use under high intensity illumination conditions such as would be found in a close-solar-approach space mission or in monitoring high intensity lamps and the like.

BACKGROUND OF THE INVENTION

The main problem area in a close-solar-approach mission is temperature. The problem begins with the fact that there is more than sufficient light to generate the power required and the unused heat input to the solar cell from the sun limits the closeness of the approach to the sun. At about a value of 0.1 AU, for example, the heat input to the solar cells is about 14 W-cm$^{-2}$. At this input level, the cell temperature rises above 400°C without special cooling. Because 200°C is the maximum operating temperature of the silicon solar cell, special steps must be taken to lower the temperature. The heating problem is also aggravated by internal (series) resistance losses in the cell. The standard cell is tailored to operate at light intensities as high as 0.28 W-cm$^{-2}$ without suffering excessive losses due to internal resistance (caused primarily by the tin, diffused surface layer). However, as the intensity rises, part of the usable power is dissipated in this resistance and this contributes not only to the heating problem but also to an undesirable loss in power output. Therefore, in order to eliminate this contribution to the heating problem, the series resistance must be reduced or the solar intensity reaching the cell must be kept below 0.28 W-cm$^{-2}$.

Several different approaches have been taken in an attempt to solve the temperature problem discussed above. First, it has been proposed that the solar cell array be tilted at an angle to the sun to reduce the power input. However, this approach is limited in its applicability because there could arise undesirable reflections that could cause heating of the spacecraft. Also, additional control maneuvers and altitude control measures on the solar cell array or the spacecraft would be required and those can complicate placing of the scientific sensors and detectors on board the spacecraft. The angle of tilt is also limited from practical considerations of alignment, stability and control.

Next, the array can be cooled with extra radiating surfaces. These can be attached to the back of the array, but at the cost of adding undesirable weight. Another approach that has been used is to increase the panel area, with only partial coverage by the solar cells, the remaining area on the front being covered with mirrors. The mirrors would be used to prevent solar radiation from being absorbed in those regions thus increasing the effective radiating area of the array. This approach, however, causes undesirable temperature gradients across the array as well as adding undesirable weight.

Further, the solar cells themselves have been coated with totally reflective stripes or patterns. The problems in this approach are similar to those encountered in the large area panel approach except the scale has been changed. The cell will have undesirable temperature gradients across its surface and the local areas that are illuminated will be inefficient due to the internal resistance problems described earlier and will thus contribute to the heating problem.

Finally, a further prior art approach of particular interest here is that disclosed in U.S. Pat. No. 3,532,551 (Scott). The Scott patent discloses a solar cell to which a fused silica cover plate is bonded, with portions of the cover plate overhanging the edges of the solar cell. A reflective coating is deposited on the lower surface of the overhanging portions of the cover plate to reduce the amount of heat absorbed by the cell and hence reduce the overall cell temperature. The advantages of the present invention over the technique taught in the Scott patent are set forth below.

The present invention is also applicable to the area of monitoring high intensity light sources. Although these sources can be monitored with thermopiles, the response such thermopiles provide is slow and does not provide a real-time measurement of the source variation. A bare solar cell used for this purpose suffers from the problems of heat and series resistance described previously. The heat problem is acute and can be partially solved by use of an auxiliary cooling system. However, this is an undesirable approach because it adds additional complexity, the cooling system requiring a bulky cooling block, a coolant circulating arrangement and suitable controls. Heat transfer through the cell to the cooling block is critical and cell mounting presents substantial problems. Further, the series resistance of the cell under high illumination is also a problem and can easily lead to errors in measurement if the cell short-circuit current is being taken as the index of intensity. Interference filters, such as formed by multi-layer dielectrics, can be used to reflect most of the light away except for a particular wavelength interval. However, there are several problems in this approach also. The filters are expensive and are prone to heating up, to changing transmission characteristics and to even cracking or other damage. As described below, the present invention can be used to circumvent all these problems and provide a rapid, accurate, real-time sensor for monitoring high intensity light sources.

SUMMARY OF THE INVENTION

In accordance with the invention, a solar cell assembly is provided which exhibits substantially improved temperature characteristics. For example, a solar cell array incorporating a plurality of such cell assemblies can be used in close-solar-approach space missions without requiring tilting or the use of additional radiating surfaces, while at the same time providing adequate power at high efficiencies.

Generally speaking, the solar cell assembly of the invention comprises a solar cell and a semi-transparent metallic layer which controls the radiant energy that is transmitted to the cell and which covers substantially the entire upper surface of the cell. The thickness of the metallic layer controls the amount of radiant energy falling on the cell surface and can be selected to provide the desired output under the operating conditions to be encountered. The low absorptivity and emissivity of the metallic coating provides a very substantial reduction of the temperature of the cell or cell array. Further, because the coating is applied over the entire upper surface of the cell, the resistance of the cell surface is greatly reduced thereby eliminating this source of power loss in the cell.

The metallic layer can be directly deposited on the solar cell surface (advantageously with a thin layer of a metal such as titanium between the surfaces to provide good electrical contact) or deposited on a cover plate secured to the cell. A further anti-reflective, high emissivity, low absorptivity layer can be used to further reduce the temperature of the cell.

It should be noted that the semi-transparent coating provided in accordance with the invention differs substantially from the reflective coating disclosed in the Scott patent referred to above, although the broad purpose of the two coatings is similar. More specifically, a basic distinction between the two techniques is that the coating of the present invention limits the incoming radiation and thereby preventing excessive cell temperatures while in the Scott device the radiation is directly absorbed by the cell and radiation surfaces are provided to radiate off excess energy. Further, the coating provided in the Scott does not have any effect on the series resistance of the solar cell while, as discussed above, the reduction of the series resistance of the cell is a very important feature of the present invention. A further significant difference concerns the provision in the Scott device of cooling panels around the edge of the cell, these panels causing undesirable temperature gradients in the cell. The semi-transparant metallic coating of the invention, being applied across the entire cell surface, uniformly screens out radiation and lowers the cell temperature without creating such gradients.

Other features and advantages of the invention will be set forth in, or apparent from, the detailed description of preferred embodiments found hereinbelow.

DESCRIPTION OF THE PREFERRED EMBODIMENTS

Figure 1:
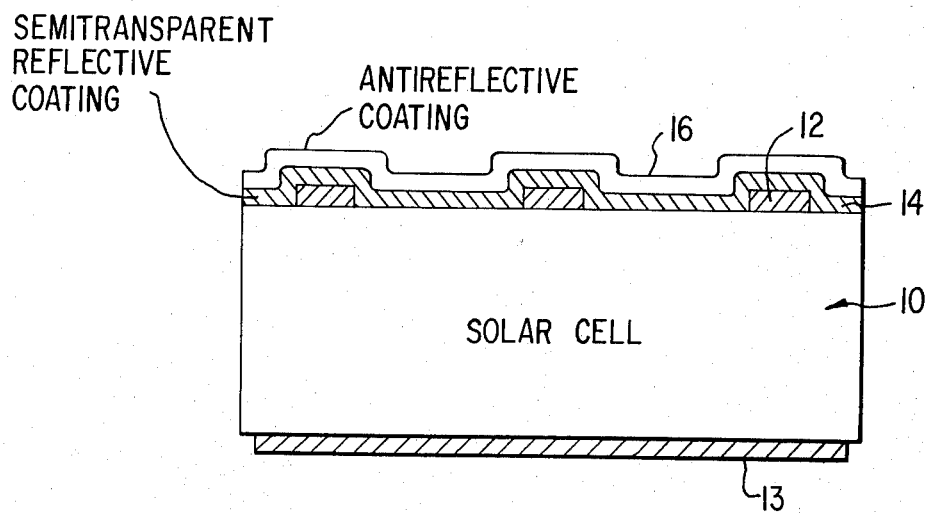
FIG. 1 is a transverse cross section of a solar cell in accordance with a first embodiment of the invention.

Referring to FIG. 1, a bare solar cell is indicated at 10, the solar cell 10 having grid fingers 12 located on the upper cell surface and a backing 13 on the lower surface.

In accordance with the invention, a semi-transparent reflective metallic layer or coating, denoted 14, is deposited directly onto the cell 10 and the grid fingers 12. The coating 14 is preferably aluminum or silver and, as indicated, covers the entire upper surface of cell 10. The thickness of the coating 14 determines the amount of light to be transmitted to the cell 10 and can be selected to produce desired output under the particular operating conditions encountered. For example, a coating or layer 14 which transmits only 5% of the light falling thereon will permit the same current-voltage output under an illumination of 20 suns as does a normal, uncoated cell under an illumination of one sun. The thickness of layer 14 is preferably in the approximate range of 100 to 1,000 Angstroms. Layer 14 can be applied to the cell 10 by a variety of methods including evaporation, sputtering, chemical deposition and the like.

An anti-reflective coating 16, of a high emissivity and low absorptivity, is applied on top of semi-transparent metallic coating 14. Coating 16, which can, for example, be SiO, protects the metallic coating 14 from being scratched as well as serving further reducing the temperature as is described below.

Because of the low absorptivity and emissivity of the metallic coating 14, the temperature of a coated solar cell 10 at 20 suns will be much lower (about 135°C) that a standard cell (above 200°C). Additionally, overcoating the metal layer 14 with a high emissivity, low absorptivity, transparent protective coating 16 will further reduce the temperature of the array under 20 suns to less that 80°C. Under these conditions there will be no need to tilt the spacecraft (although this can still be done) or perform other complicated maneuvers to keep the cell or cell array cool. It will be understood that tilting can be used as an additional measure where even higher illumination levels are encountered, such as even closer approaches to the sun.

As mentioned above, because the metal coating 14 is applied over the entire top surface of the solar cell 10, the resistance of the surface is greatly reduced, thereby completely eliminating this source of power loss in the cell. In order to promote good, electrical contact between the coating 14 and the cell 10 it may be necessary to add a thin metal layer (not shown) between these two surfaces. This layer can, for example, be titanium.

Figure 2:
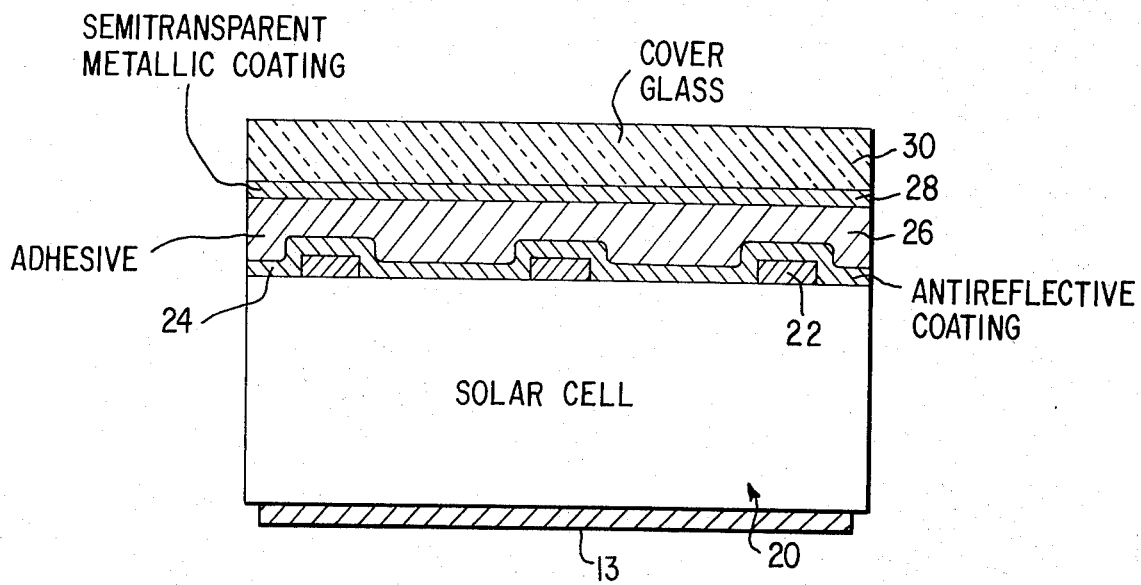
FIG. 2 is a transverse cross section of an alternate embodiment of the invention.

Referring to FIG. 2, an alternate embodiment of the solar cell of the invention is shown. In this embodiment, the main solar cell 20 and the grid fingers 22 attached to the upper surface thereof are coated with an anti-reflective coating 24 of a material with high emissivity and low absorptivity which, as illustrated, overlays on the top surface of the solar cell 20. On top of the anti-reflective coating 24 is a layer of adhesive 26. A cover glass 30, which is coated on the underside with a semi-transparent metallic coating 28, is attached by adhesive 26 to cell 20. The use of a cover glass such as indicated at 30 eliminates the possibility of abrasion of metallic coating 28. Adhesive 26 can be any of a number of conventional compositions such as silicone adhesive or Teflon FEP while the other layers, and thicknesses thereof, are the same as given above for the embodiment of FIG. 1. A disadvantage of the embodiment of FIG. 2 is that the arrangement shown will not reduce the series cell resistance. However, the internal resistance of the cell may not be critical where the intensity of the illumination level transmitted to the cell is below about 2 suns (0.28 w-CM$^2$).

While the invention has been described in detail with particular reference to the preferred embodiments thereof, it will be understood by those skilled in the art that variations and modifications can be effected in the exemplary embodiments within the spirit and scope of the invention.

I claim:
1. A solar cell assembly comprising
    a solar cell, and
    a semi-transparent metallic layer of approximately 100–1000 Angstroms thickness, which covers substantially the entire upper surface of the solar cell, for controlling the radiant energy which is transmitted to the solar cell.
2. A solar cell assembly as claimed in claim 1 wherein said metallic layer comprises a metallic coating deposited directly on the upper surface of said solar cell.

3. A solar cell assembly as claimed in claim 2 further comprising an anti-reflective layer fabricated of a high emissivity, lower absorptivity material covering said metallic coating.

4. A solar cell assembly as claimed in claim 1 further comprising a cover plate for said cell, said metallic layer comprising a metallic coating on the undersurface of said cover plate.

5. A solar cell assembly as claimed in claim 1 wherein said metallic layer comprises an aluminum coating.

6. A solar cell assembly as claimed in claim 1 wherein said metallic layer comprises a silver coating.

7. A solar cell assembly comprising
a solar cell,
a semi-transparent metallic layer covering substantially the entire upper surface of the solar cell for controlling the radiant energy which is transmitted to the solar cell, and
a high emissivity, low absorptivity anti-reflective coating overlying said metallic layer.

8. A solar cell assembly comprising
a solar cell,
a cover plate for protecting the upper surface of said solar cell,
a semi-transparent metallic layer on the surface of the said cover plate facting said protected surface of said solar cell, and
a high emissivity, low absorptivity anti-reflective layer overlying said protected surface of the solar cell, said cover plate being secured to said anti-reflective layer.

9. A solar cell assembly as claimed in claim 8 wherein said cover plate comprises a glass plate and said anti-reflective layer comprises a SiO layer.

* * * * *